(12) United States Patent
Villermet et al.

(10) Patent No.: US 7,699,022 B2
(45) Date of Patent: Apr. 20, 2010

(54) DEVICE FOR THE ZONAL SURFACE TREATMENT OF AN ARTICLE BY DIELECTRIC BARRIER DISCHARGE

(75) Inventors: Alain Villermet, Viroflay (FR); François Coeuret, Guyancourt (FR); Jacques Delumeau, Montmorency (FR)

(73) Assignee: L'Air Liquide, Societe Anonyme a Directoire et Conseil de Surveillance pour l'Etude et l'Exploitation des Procedes Georges Claude, Paris (FR)

( * ) Notice: Subject to any disclaimer, the term of this patent is extended or adjusted under 35 U.S.C. 154(b) by 742 days.

(21) Appl. No.: 10/556,949

(22) PCT Filed: May 7, 2004

(86) PCT No.: PCT/FR2004/001121

§ 371 (c)(1),
(2), (4) Date: Feb. 8, 2007

(87) PCT Pub. No.: WO2004/105079

PCT Pub. Date: Dec. 2, 2004

(65) Prior Publication Data

US 2007/0119374 A1    May 31, 2007

(30) Foreign Application Priority Data

May 21, 2003    (FR) .................................. 03 06084

(51) Int. Cl.
  *C23C 16/00* (2006.01)
  *C23F 1/00* (2006.01)
  *H01L 21/306* (2006.01)
(52) U.S. Cl. .............................. 118/723 E; 156/345.43
(58) Field of Classification Search ................. 118/715, 118/722, 723 R, 723 E; 156/345.43, 345.44, 156/345.45, 345.46, 345.47; 315/111.21
See application file for complete search history.

(56) References Cited

U.S. PATENT DOCUMENTS 3,760,153 A * 9/1973 Davies et al. ............... 219/384

(Continued)

FOREIGN PATENT DOCUMENTS

EP    0 622 474    11/1994

(Continued)

*Primary Examiner*—Parviz Hassanzadeh
*Assistant Examiner*—Maureen Gramaglia
(74) *Attorney, Agent, or Firm*—Donna Blalock Holguin

(57) ABSTRACT

The invention relates to equipment for area-based surface treatment of an article by electric dielectric barrier discharge in the presence of a non-atmospheric controlled gaseous mixture, comprising a hollow metal electrode enabling the gaseous mixture to circulate therewithin and the mixture to be transported to a discharge area, whereby said electrode is divided into individual elements which can each be pivoted about a central axis to ensure sufficient distance between the element which is considered as being pivoted and the area of the article opposite the element in question so that the discharge cannot develop; the central pivoting axis is used as a channel for the circulation of the gaseous mixture inside the electrode and is provided with openings enabling the gaseous mixture to be evacuated to the discharge area; pivoting one of the elements of the electrodes blocks up the evacuating opening associated therewith and the gaseous mixture can only be evacuated via the evacuating openings of non-pivoted elements.

3 Claims, 4 Drawing Sheets

Element not swung away     Element swung away

U.S. PATENT DOCUMENTS

| | | | |
|---|---|---|---|
| 5,576,076 | A | 11/1996 | Slootman et al. |
| 6,007,784 | A | 12/1999 | Jorgensen |
| 6,299,948 | B1 | 10/2001 | Gherardi et al. |
| 6,458,330 | B1 | 10/2002 | Cocolios et al. |
| 2003/0075432 | A1 | 4/2003 | Cocolios et al. |

FOREIGN PATENT DOCUMENTS

| | | |
|---|---|---|
| GB | 2 014 799 | 8/1979 |
| WO | WO 01 13202 | 3/2000 |
| WO | WO 01 58992 | 8/2001 |
| WO | WO 02 40738 | 5/2002 |

* cited by examiner

DEVICE FOR THE ZONAL SURFACE TREATMENT OF AN ARTICLE BY DIELECTRIC BARRIER DISCHARGE

The present invention relates to the field of surface treatment by a corona discharge in a controlled gaseous atmosphere (especially nitrogen-based atmospheres, which include controlled additions of silane, or else $CO_2$, $N_2O$, $H_2$, etc.).

The applicant has filed many publications in this field—the reader may for example refer to the following documents: EP-1 108 264, EP-622 474, WO 01/58992 or WO 02/40738.

These processes and equipment are used to treat a running substrate uniformly over its entire width. Such a treatment is perfectly suitable for very many industrial applications.

However, when the surface of a film is treated by corona discharge, whether in air or in a controlled gaseous atmosphere, heat sealing becomes difficult.

The situation is therefore one in which the films intended to be both printed on one part and sealed on another part have to combine the a priori contradictory characteristics of good printing (thanks to the corona treatment) and good sealability (untreated film). The same applies to films intended to be both laminated in one part to a substrate and sealed on another part.

This industry has of course studied this technical problem, and it may be summarized that two proposed solutions presently exist for combining these two a priori contradictory technical characteristics:

either the sealing temperature is increased, in which case this solution allows the corona-treated films to be sealed, but the resulting consequences as regards the manufacturing line for the final product are unacceptable for industrial-scale production and moreover have not been accepted by a good number of polymer film converters;

or the corona treatment is applied to the zones that have to be printed or laminated but not applied to the zones that have to be sealed: this solution is the one presently adopted by practically the entire profession—it is effective thanks to the commercially available "zonal treatment" systems of air corona stations.

The commercially available "zonal treatment" systems of air corona stations (see below in FIG. 1 for further details about their arrangement) consist of a metal electrode formed from small independent elements that can swing about an axis. When the elements have been swung away from the surface of the film to be treated, these elements, although connected to the high voltage, thus no longer create a discharge on the surface of the film. In contrast, the electrode elements that have not been swung away can create a discharge on the surface of the film. In this way, the corona treatment is applied beneath the elements that have not been swung away, while it is not applied beneath the elements that have been swung away (zoning treatment). The zones of the film passing beneath the elements that have not been swung away can therefore be printed (or laminated), whereas the zones of the film passing beneath the elements that have been swung away are sealable.

To illustrate this state of the art of zoned corona treatment processes, the reader may refer for example to documents GB-2 014 799 and U.S. Pat. No. 6,007,784.

As has just been seen, the air corona treatment can be easily applied in zones, and to do this all that is required is to prevent the electrical discharge from being created beneath certain elements.

However, as will now be seen, in applications in which the corona treatment is carried out in a controlled gaseous atmosphere, the electrode serves not only as high-voltage support for applying the electrical discharge but also serves for injecting the treatment gas mixture. Since the electrode is for example hollow, in order to allow the gas mixture to flow and to be injected into the discharge, a zonal treatment carried out using the air-corona swinging element model of FIG. 1 would make it difficult to seal between the elements that have been swung away and the elements that have not been swung away, difficult to supply the electrode with the gas mixture or else difficult to support the entire electrode. Now, a corona treatment in a gaseous atmosphere is effective if the gas mixture is injected at a controlled flow rate into the very core of the discharge. It is therefore imperative to ensure that all the electrode elements used for the treatment are correctly supplied with the gas mixture.

Poorly controlled sealing between the electrode elements runs the risk of the gas mixture irretrievably leaking at the joints between the elements that have been swung away and those that have not. Since the gas mixture is then injected only partly into the core of the discharge, or even not at all, the quality of the treatment would then become random.

A zonal corona treatment in a controlled gaseous atmosphere can therefore be correctly carried out only provided that the following two criteria are met:

no electrical discharge is created beneath certain zones of the electrode (as in the case of the swung-away elements in the air corona treatments of the prior art);

the gas mixture is distributed, with a controlled flow rate, through the zones of the electrode used for the treatment.

One possible solution for meeting these two conditions would be to manufacture an electrode composed of elements that are entirely independent of one another, each element constituting a complete electrode with its own high-voltage supply and its own gas mixture feed. This solution has the advantage of ensuring that the elements are sealed, since a complete electrode has not only its own supply and feed but also walls that provide the sealing and allow all of the gas mixture to flow only into its intended point, namely the core of the discharge.

However, this solution is not easily achievable in practice since the dimensions of each electrode element are of the order of 1 cm, or even 5 mm. For the widths typically used in industry, namely around 1 to 2 meters, it would be difficult to imagine manufacturing and assembling a few hundred electrodes, each having a high-voltage connection and a gas mixture feed, which itself consists of tubes and fittings, all this having to be sealed and measuring less than 1 cm in length. This solution therefore appears to be unachievable from a practical standpoint.

Another solution would be to separate the two functions of the electrode, namely the high-voltage supply and the injection of the gas mixture into the discharge. In this case, it is conceivable to use a zonal air-corona treatment electrode with swinging elements supplied just with high voltage (as in the example of FIG. 1) and to place nearby a gas mixture injection nozzle. This solution has the advantage of there never being any risk of a loss of sealing between the electrode elements since the gas mixture does not flow inside them. However, the nozzle, separate from the electrode but placed near it, must allow the gas mixture to be injected into the core of the discharge. Owing to the dimensions involved in this method, namely more precisely a height of the discharge zone typically of the order of 1 mm, it is difficult to conceive a way of ensuring that the gas mixture flows correctly into the core of the discharge without having to increase the flow of this same gas mixture in the nozzle. The difference between the flow in the nozzle and that feeding the discharge obviously corresponds to that portion of the gas mixture which does not reach this confined space 1 mm in height where the discharge develops. Economically, this "lost" gas mixture portion is difficult for customers in this industry to accept, as it corresponds to an additional cost since the flow that has to be injected into the core of the discharge is set in order to ensure that the treatment is entirely effective. This solution therefore appears not to be very conceivable from the economic standpoint.

It will therefore be understood that, for this industry, it would be beneficial and necessary to be able to provide a novel solution for corona discharge surface treatment in a controlled gaseous atmosphere that allows zonal treatment under conditions that are acceptable both technically and economically.

To do this, the present invention provides equipment for the zonal surface treatment of an article, by dielectric barrier discharge, in the presence of a treatment gas mixture, characterized by the following measures being implemented:

it comprises a hollow metal electrode for the gas mixture to flow therein and for this gas mixture to be conveyed right into the discharge zone;

the electrode being divided into individual elements each capable of being swung about a central shaft in order to provide a sufficient distance between the swung-away element in question and that zone of the article opposite the element in question so that the discharge cannot extend therein;

the central swing shaft serves as channel for the gas mixture to flow within the electrode, and is provided with outlet orifices for the gas mixture to enter the discharge zone; and when one of the electrode elements is swung away, the outlet orifice associated therewith is blocked, the gas mixture being able to escape only via the outlet orifices of the elements that are not swung away.

According to one of the embodiments of the invention, each individual element includes an individual central homogenization chamber located opposite its outlet orifice, the set of individual central chambers forming a central homogenization chamber over the entire length of the electrode, which itself can be fed with the gas mixture via said outlet orifices, each individual central homogenization chamber being provided with an injection slot for injecting gas onto the article and each individual element is provided with a rear part capable, when the element in question is swung away, of pushing away the individual central homogenization chamber associated therewith so as to be positioned between the individual central homogenization chambers of its neighboring elements that have not been swung away, and thus of blocking, in said manner, the outlet orifice of the element in question, the rear part of which has been swung away.

According to one of the embodiments of the invention, the central swing shaft homogenizes the gas flow as it is provided with baffle-type components for creating turbulence in the gas mixture.

The notion of "treatment gas mixture" must be understood according to the invention as meaning a controlled gas mixture, and therefore not the atmospheric air (for example a nitrogen-based atmosphere that includes controlled additions of silane, or else $CO_2$, $N_2O$, $H_2$ etc.).

As will be clearly apparent to those skilled in the art, for the sake of clarity the presence of a counterelectrode coated with a dielectric material was not mentioned above, the counterelectrode of course being present, with the article located between the electrode and the counterelectrode or actually running over the counterelectrode. For the same reasons, said counterelectrode does not appear in the figures appended hereto.

As will have been seen above, according to one of the embodiments of the invention each individual element is provided with a rear part capable, when the element in question is swung away, of pushing back the individual central homogenization chamber associated therewith so as to be positioned between the individual central homogenization chambers of its two neighboring elements, and thus of blocking the outlet orifice of the element in question, the rear part of which has been swung away. The figures below will better explain the various conceivable situations, where, depending on which elements have been swung away (isolated elements or several consecutive elements), a given rear part will be positioned between two immediately adjacent central chambers or else several consecutive rear parts will be swung down and will block the space lying between the central chambers which are adjacent thereto and which themselves have not been displaced.

Other features and advantages will become apparent from the following description, given solely by way of example and with reference to the appended drawings in which.

Figure 1:
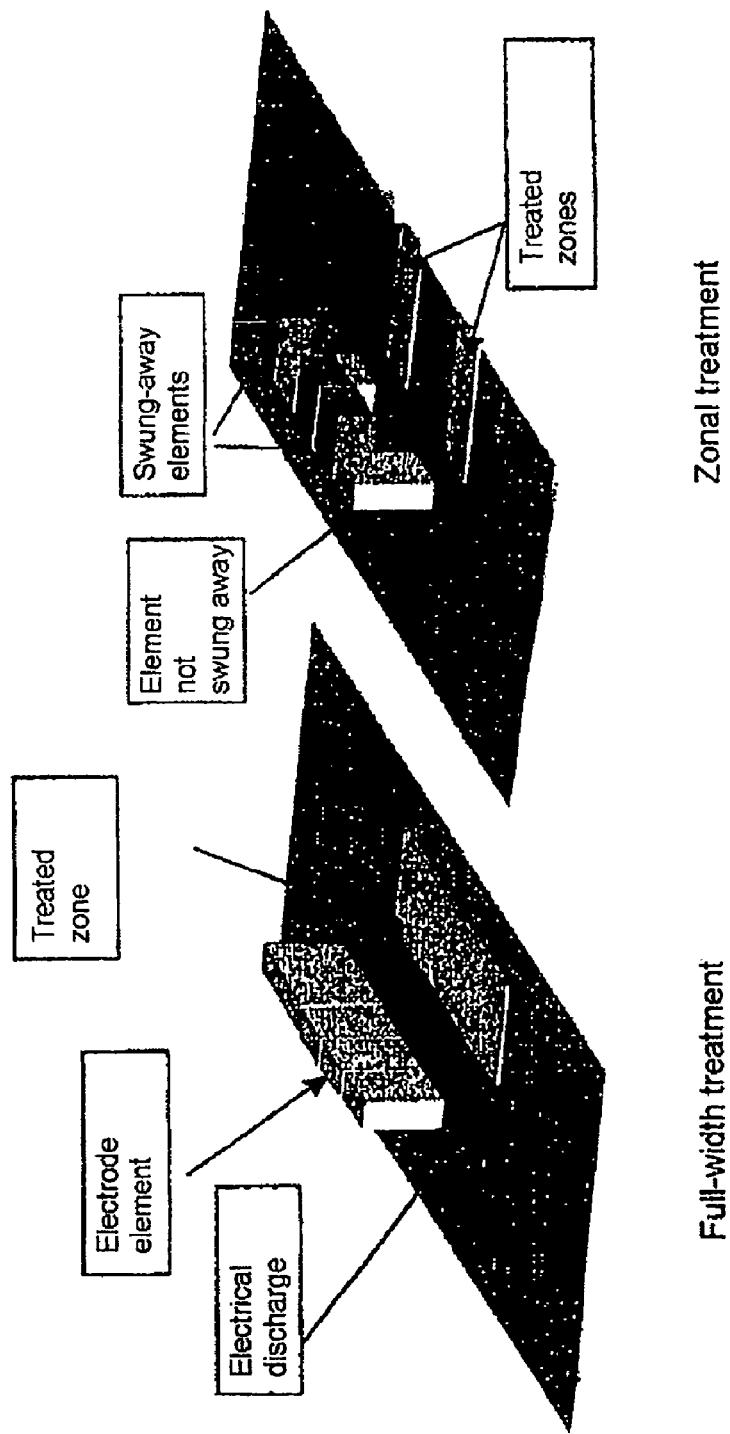
FIG. 1 is a schematic view of a zonal air corona treatment installation according to the prior art.

As mentioned above, FIG. 1 shows a "zonal" air corona treatment system, which consists of a metal electrode formed from small juxtaposed independent elements, each able to swing about an axis. The elements that have been swung away are far from the surface of the film to be treated and thus these elements, although connected to the high voltage, can no longer create a discharge on the surface of the film that is facing them. In contrast, the electrode elements that have not been swung away can create a discharge on the surface of the film that is facing them. In this way, the corona treatment is applied beneath the elements that have not been swung away and is not applied beneath those that have been swung away (zoning). There is thus a clear distinction between the configuration on the left in the figure, in which no electrode element has been swung away and the treatment is therefore carried out over the entire width, and the configuration on the right in which certain electrode elements have been swung away (i.e. raised and therefore far from the surface of the film) and in which therefore only certain zones of the film are treated (those facing an electrode element that has not been swung away).

Figure 2:
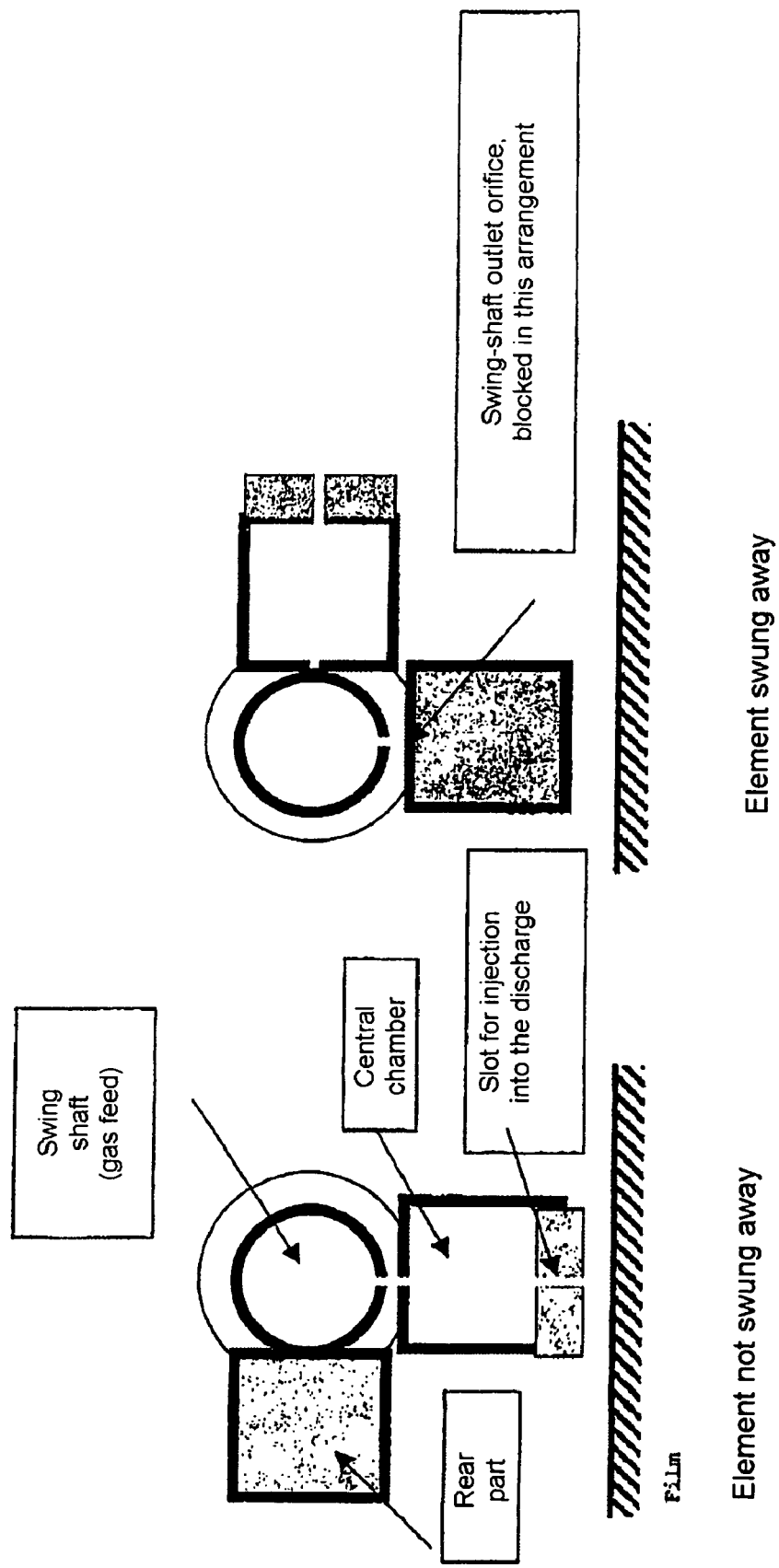
FIG. 2 illustrates schematically the configuration of an electrode element according to the invention in the two arrangements envisaged, i.e. swung away and not swung away.

FIG. 2 itself illustrates one embodiment of an electrode according to the invention, divided into individual elements (typically with a length of between 5 and 10 mm in the embodiment shown), comprising a central shaft about which the set of elements can swing, which shaft also provides the general supply of gas mixture and is provided with outlet orifices over its entire length so as to distribute the gas mixture as uniformly as possible over the entire length of the electrode. The outlet orifice of the central shaft serves to feed the gas mixture into a central chamber, which is itself provided with an injection slot for injecting gas onto the running film.

Sealing between adjacent elements is maintained according to the invention by the presence of a rear part (a kind of shoulder) with each element. Thus, when an element is swung away, its rear part comes exactly opposite the central chambers of its neighbors, being positioned therebetween. Thus, in the swung-away position, the outlet orifices of the central shaft (which feed each central chamber with gas) are obstructed by the rear shoulder when the corresponding element has been swung away. In this way, the gas mixture no longer feeds the elements that have been swung away and can escape only via the injection slots of the elements that have not been swung away.

The gas mixture is thus used, in its entirety and without substantial loss, to feed the discharge. This means that the process remains economically acceptable for those in the polymer film conversion industry.

Such a system combines:

simplicity of implementation and manufacture thanks to centralized electrical supply and centralized gas feed for all the elements;

with full use of the gas mixture, thus incurring no additional operating cost.

The fact that all the elements are made of metal means that each of these elements can be supplied with high voltage by supplying only one end of the electrode, the high voltage being transmitted by contact between adjacent elements.

Figure 3:
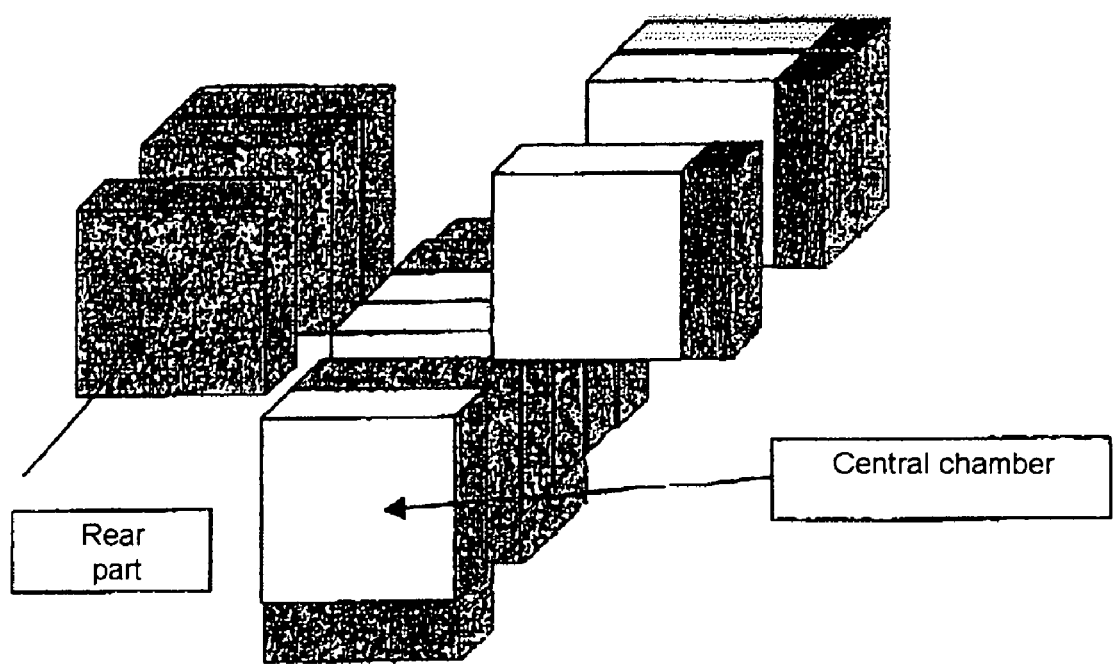
FIG. 3 shows more clearly the embodiment of FIG. 2 in the case of a set of six electrode elements.

FIG. 3 allows the embodiment of FIG. 2 to be better understood in the case of a set of six electrode elements, showing the two arrangements, namely swung away and not swung away. When an element is swung away, its corresponding rear shoulder pushes away the central chamber corresponding thereto and is positioned between the two central chambers that form its immediate neighbors. It will be noted that, in order not to clutter up the figure, the electrode swing shaft has not been shown.

Of course, it will be understood that when several consecutive rear parts are swung down, they block the space lying between the central chambers which are adjacent thereto and which themselves have not been displaced.

Figure 4:
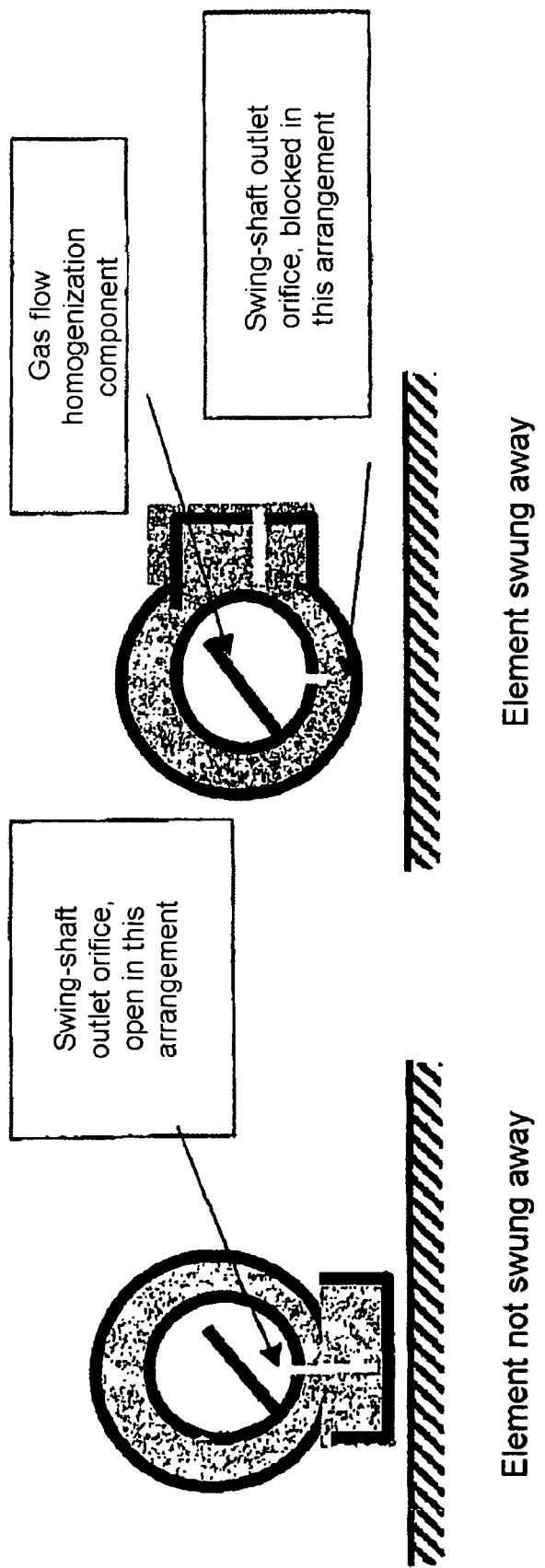
FIG. 4 illustrates another embodiment of the invention in which the electrode swing shaft also serves as central chamber.

FIG. 4 for its part illustrates an alternative embodiment of the invention in which the central chamber and the central swing shaft are merged within one and the same component. In this configuration, the homogenization of the gas flow (brought about by the central chamber in the configuration described above at length) is in this case brought about by the central swing shaft. To do this, the latter advantageously contains baffle-type components so as to create sufficient turbulence in the gas flow to ensure uniform injection over the entire length of the electrode.

In the swung-away situation, the element is far enough from the film not to create an electrical discharge but, however, the outlet orifices of the central swing shaft have been blocked.

It will therefore be clearly understood from the foregoing description that certain zones are not treated by preventing a discharge from developing opposite the elements that have been swung away. However, all the electrode elements are connected to the high voltage, whether or not they are swung away. Thus, all the elements are capable of creating a discharge at the surface of the film. Given that the discharge height (the distance between the elements not swung away and the surface of the film) in the zones to be treated is of the order of 1 mm, it is recommended to provide a distance of more than 1 cm between the elements swung away and the film. Since the voltage supplying the electrode is designed to create a discharge of height 1 mm, this 1 cm distance is great enough for the electrode voltage to remain below the breakdown voltage of the discharge between a swung-away element and the film. In this way, the film is treated by the elements that are not swung away and is not treated in specified zones of the film by the corresponding elements being swung away therefrom.

To be able to use all of the gas mixture for the treatment—namely its injection into the core of the discharge—and to prevent any substantial leakage, which would be synonymous with an additional process cost, excellent sealing must be provided at the central chambers of all the elements. This sealing must be provided in the following two situations:

the sealing between two adjacent elements in the same arrangement (both swung away or both not swung away) is provided by close contact between the contours of the central chambers of the two elements. This is achieved only on condition that:
1. the contact between the two elements is kept sufficiently close; and
2. the roughness of the contact surfaces is low enough to allow plane/plane-type contact over all of these two facing surfaces; and the sealing between two adjacent elements in different arrangements (one being swung away and the other not swung away) is provided by close contact between the contour of the central chamber of the element not swung away and the rear part of the element swung away. This is achieved only on condition that:
1. the contact between the two elements is kept sufficiently close;
2. the rear part of the swung-away element comes opposite the central chamber of the adjacent element that is not swung away; and
3. the roughness of the contact surfaces is low enough to allow plane/plane-type contact over all of these two facing surfaces.

The invention claimed is:

1. Equipment for the zonal surface treatment of an article, by dielectric barrier discharge, in the presence of a treatment gas mixture, characterized by the following measures being implemented:
   a) it comprises a hollow metal electrode for the gas mixture to flow therein and for this gas mixture to be conveyed right into the discharge zone;
   b) the electrode being divided into individual elements each capable of being swung about a central shaft in order to provide a sufficient distance between the swung-away element in question and that zone of the article opposite the element in question so that the discharge cannot extend therein;
   c) the central swing shaft serves as a channel for the gas mixture to flow within the electrode, and is provided with outlet orifices for the gas mixture to enter the discharge zone, each outlet orifice being associated with an individual element of the electrode; and
   d) when one of the electrode elements is swung away, the outlet orifice associated therewith is blocked, the gas mixture being able to escape only via the outlet orifices of the elements that are not swung away.

2. The zonal surface treatment equipment of claim 1, wherein each individual element includes an individual central homogenization chamber located opposite its outlet orifice when the element is not swung away, the set of individual central chambers forming a central homogenization chamber over the entire length of the electrode, which itself can be fed with the gas mixture via said outlet orifices, each individual central homogenization chamber being provided with an injection slot for injecting gas onto the article and each individual element is provided with a rear part capable, when the element in question is swung away, of pushing away the individual central homogenization chamber associated therewith so as to be positioned between the individual central homogenization chambers of its neighboring elements that have not been swung away, and thus of blocking, in said manner, the outlet orifice of the element in question, manner, the outlet orifice of the element in question, which has been swung away.

3. The zonal surface treatment equipment of claim 1, wherein the central swing shaft homogenizes the gas flow as it is provided with baffle-type components for creating turbulence in the gas mixture.

* * * * *